United States Patent [19]

Inoguchi et al.

[11] Patent Number: 5,236,777
[45] Date of Patent: Aug. 17, 1993

[54] METHOD FOR PRODUCING TREATED GLASS CLOTH

[75] Inventors: Hirokazu Inoguchi; Keiichi Kato, both of Fukushima, Japan

[73] Assignee: Nitto Boseki Co., Ltd., Fukushima, Japan

[21] Appl. No.: 604,932

[22] Filed: Oct. 29, 1990

[30] Foreign Application Priority Data

Nov. 15, 1989 [JP] Japan .................................. 1-296861
Jul. 11, 1990 [JP] Japan .................................. 2-183876

[51] Int. Cl.⁵ ........................................... D03D 15/10
[52] U.S. Cl. ................................... 428/268; 428/245; 428/273; 428/378; 428/391; 427/386; 427/387; 427/389.8; 427/407.3
[58] Field of Search ...................... 427/386, 387, 389.8, 427/407.3, 353, 336, 154; 428/378, 391, 392, 245, 268, 273; 65/3.1

[56] References Cited

U.S. PATENT DOCUMENTS

| | | | |
|---|---|---|---|
| 2,776,910 | 1/1957 | Erickson et al. | 427/353 |
| 3,336,253 | 8/1967 | Wong et al. | 260/29.2 |
| 3,661,627 | 5/1972 | Serlin | 117/54 |
| 3,922,436 | 11/1975 | Bell et al. | 427/407.3 |
| 3,935,344 | 1/1976 | Haggerty et al. | 428/378 |
| 4,009,132 | 2/1977 | Furukawa et al. | 427/389.8 |
| 4,491,611 | 1/1985 | Barnhoom et al. | 427/386 |
| 4,530,876 | 7/1985 | Brodmann et al. | 427/389.9 |
| 4,584,110 | 4/1986 | Rammel | 252/8.8 |
| 4,749,614 | 6/1988 | Andrews et al. | 428/290 |
| 4,758,279 | 7/1988 | Hasuly et al. | 106/213 |
| 4,981,754 | 1/1991 | Hsu | 428/288 |

FOREIGN PATENT DOCUMENTS

| | | |
|---|---|---|
| 027942 | 5/1981 | Fed. Rep. of Germany . |
| 57071837 | 5/1982 | Japan . |
| 62-260832 | 11/1987 | Japan . |
| 63-107847 | 5/1988 | Japan . |
| 63-108035 | 5/1988 | Japan . |

OTHER PUBLICATIONS

J. Klunder, "Fiberglass Reinforced Plastics", pp. 5-7 (1979).
Chang, Chin-chun, "New Knowledge for Application of Reinforced Plastics", No. 18, Jul., pp. 66-69 (1983).
Chang, Chin-chun, "New Knowledge for Application of Reinforced Plastics", No. 20, Jan. pp. 12-21 (1984).
A. J. Majumdar, "Strong Fibers", Elsevier Science, pp. 72-74 (1985).
Lai, Keng-yeng, "Practice for Application of Epoxy Resins", pp. 42-55.
Yu, Hsi-yang, "New Knowledge for Application of Reinforced Plastics", No. 8, pp. 36-42, Apr. 1980.

*Primary Examiner*—Shrive Beck
*Assistant Examiner*—Diana Dudash
*Attorney, Agent, or Firm*—Darby & Darby

[57] ABSTRACT

The present invention provides a method for producing a glass cloth which is suitable as a reinforcing material for making resin laminates and which comprises subjecting filaments of glass fibers to a sizing treatment with a sizing agent containing at least one water-soluble film forming agent selected from the group consisting of an amine-modified epoxy resin, an ethylene oxide-added epoxy resin and ethylene oxide-added bisphenol A as film forming component, forming glass yarns from the thus treated filaments, weaving the glass yarns to make a glass cloth, washing the glass cloth with water until the loss of ignition of the sizing agent to the glass cloth reaches 0.25% by weight or less, and then treating this glass cloth with a solution of a surface treating agent.

16 Claims, No Drawings

METHOD FOR PRODUCING TREATED GLASS CLOTH

BACKGROUND OF THE INVENTION

The present invention relates to a method for producing a glass cloth suitable to be used as reinforcing materials for making a resin laminate reinforced with glass cloth.

A glass cloth is made by weaving glass yarns treated with a sizing agent comprising starch as a main component of a film forming agent for satisfying processability in the respective steps of spinning, twisting, warping, and weaving. When glass cloth treated with such sizing agent, mainly composed of starch, is used as a reinforcing material for making resin laminates, the starch is usually removed from the glass cloth after weaving because starch gives an adverse effect on the adhesion between matrix resins such as the polyester resin and epoxy resin and the glass fibers constituting the glass cloth.

As a method for removing the starch type sizing agent, namely by desizing or cleaning, there has been proposed a water washing method using surface active agent, enzyme and the like (Japanese Patent Kokai Nos. 63-107847 and 63-108035) and a heating method. However, it is difficult to completely remove the starch type sizing agent by desizing by water washing and at present, desizing is mostly carried out by heating. The method of desizing by heating is a batch type method which comprises heating a rolled glass cloth (roll) at 400°-500° C. for about 30-50 hours in a heating furnace to burn off the starch type sizing agent.

The desizing by heating which is generally carried out is of batch type cannot be continuously conducted. Further, since the time of one cycle is long, the number of rolls used in one cycle must be increased. Thus, a large heating furnace is required and a space for preparation of rolls used for the next cycle is necessary. Furthermore, since heating at high temperature is carried out for a long time, strength of glass cloth is deteriorated and the cost for energy increases.

In an attempt to omit the desizing step, a sizing treatment has been proposed so that the glass cloth after weaving can be used as it is for molding. That is, this method is based on the idea that when a sizing agent comprising an urethane emulsion or an epoxy emulsion is used as the main component of the film forming agent. The resulting glass cloth is molded together with a matrix resin. Thus, the molding can be satisfactorily performed because the emulsion is not as poor in compatibility with the resin as the starch is. However, this method also has the problem in that process-ability in the respective steps of from spinning to weaving is not satisfactory and that impregnation of the resin is insufficient. That is, viscousness of the film forming agent cannot be inhibited and the film forming agent adheres to the traveller and reed in the twisting and weaving steps to cause fluffing or breaking of the yarns. Moreover, if impregnation is not sufficient, the reinforcing effect is not exhibited and the properties of the laminate after molding are inferior.

The above method of desizing by heating is especially not suitable for glass cloth made by weaving high-silica glass yarns containing more than 60% by weight of silica ($SiO_2$). Glass fibers used at present for making glass yarns of more than 60% by weight in silica content include the three kinds of glass fibers (D-glass, S-glass and Q-glass) as shown in the following Table 1.

TABLE 1

|  | E-glass (%) by weight | D-glass (%) by weight | S-glass (%) by weight | Q-glass (%) by weight |
|---|---|---|---|---|
| $SiO_2$ | 52–56 | 73.0 | 65.0 | 99.0 |
| $Al_2O_3$ | 12–16 | 2.0 | 25.0 | — |
| CaO | 16–25 | — | — | — |
| MgO | 0–6 | — | 10.0 | — |
| $B_2O_3$ | 8–13 | 22.0 | — | — |
| $R_2O$ | 0–3 | 3.0 | — | — |

E-glass fiber is a non-alkali glass fiber and is used for electrical insulation. D-glass fiber is a low-dielectric glass fiber and is used as substrate for a printed circuit board which requires a low dielectric. S-glass fiber is a high-modulus and high-strength glass fiber and is used as reinforcing materials for construction. Q-glass fiber (quartz glass fiber) is at least 99% by weight in silica content, excellent in heat resistance, and has a low thermal expansion coefficient Q-class fiber is increasingly utilized as a substrate for a printed circuit board for special use.

When glass cloth made from yarns of the three kinds of glass fibers of at least 60% in silica content is desized by heating, the following problems have occurred. That is, D-glass cloth cannot be completely desized by heating. Besides, a laminated sheet made by using the thus desized D-glass cloth becomes yellowish. Moreover, as can be seen from Table 1, D-glass has a relatively high $B_2O_3$ component and so there is the problem that when it is heated for a long time of 30–50 hours at 400°–500° C., which are the conditions for desizing by heating, a considerable amount of the $B_2O_3$ component is evaporated. Therefore, the glass composition formed after desizing by heating differs from the composition present before subjected to desizing. In the case of S-glass cloth, strength of the glass cloth decreases owing to the heating for desizing as shown in Table 2.

TABLE 2

|  | S-glass cloth | | E-glass cloth | |
|---|---|---|---|---|
|  | Warp | Weft | Warp | Weft |
| Tensile strength of cloth as woven (Kg/25 mm) | 101.5 | 90.3 | 83.1 | 69.2 |
| Tensile strength of cloth after desizing by heating (Kg/25 mm) | 35.1 | 31.7 | 21.0 | 20.0 |
| Tensile strength of cloth after surface treatment (Kg/25 mm) | 58.0 | 56.4 | 34.6 | 33.4 |

Note:
(1) S-glass cloth: WTA 116E (manufactured by Nitto Boseki Co., Ltd.)
(2) E-glass cloth: WEA 116E (manufactured by Nitto Boseki Co., Ltd.)

Table 2 shows the change of tensile strength of the glass cloth. Tensile strength of original cloth as woven to about 30% by subjecting it to desizing by heating. The reduced tensile strength of this original cloth returns to 40–60% of that of the original cloth as woven, by subjecting it to surface treatment. However, the effect of desizing by heating on the tensile strength of the glass cloth is high. Especially, although deterioration of S-glass cloth by heating is smaller than deterioration of E-glass cloth by heating, since S-glass cloth is used because of its high strength, the deterioration of this strength makes it meaningless to use S-glass cloth. In the case of Q-glass cloth, this is wound around an iron core for desizing by heating and put in a furnance for desizing. The thermal expansion coefficient of the Q-glass cloth wound around the iron core is smaller than that of the iron core and, hence, tearings are generated in the cloth. Therefore, employment of desizing by heating is especially difficult for desizing of high-silica glass cloth of 60% or more in silica content.

SUMMARY OF THE INVENTION

The object of the present invention is to provide a method for producing a glass cloth which is good in processability in respective steps and is good in impregnation with resin without desizing and at low cost. The method is free from the above mentioned defects.

DESCRIPTION OF THE INVENTION

In the present invention, glass filaments which constitute glass yarns which are woven to make a glass cloth are subjected to a sizing treatment (primary sizing treatment) with a sizing agent containing the following film forming agent component, coupling agent component, and lubricant component.

An epoxy resin which is water-solubilized by modification with an amine, or the addition of an ethylene oxide or, bisphenol A which is water-solubilized by addition of ethylene oxide, or a mixture thereof is used as the main component of a film forming agent in the sizing agent. The amount of the film forming agent component contained in the sizing agent is 1.0-5.0% by weight, and, preferably, 2.0-4.0% by weight as an effective component.

In the present invention a silane coupling agent is used as the coupling agent component in the sizing agent. The silane coupling agent includes, for example, γ-aminopropyltriethoxysilane, N-β-(aminoethyl)-γ-aminopropyltrimethoxysilane, N-β-(N-vinylbenzylaminoethyl)-γ-aminopropyltrimethoxysilane hydrochloride, γ-methacryloxypropyltrimethoxysilane, vinyl-tri(β-methoxyethoxy)silane, γ-glycidoxypropyltrimethoxysilane, and mixtures thereof. The amount of the coupling agent component in the sizing agent is 0.05-2.0% by weight, preferably, 0.2-0.6% by weight as an effective ingredient.

As the lubricant component in the sizing agent of the present invention, there may be used a tetraethylenepentamine distearate and a butyl stearate in an amount of 0.03-0.15% by weight and 0.2-1.0% by weight, respectively as effective ingredients.

In the present invention, the amount of the sizing agent present on the treated glass yarns is preferably 0.3-1.0% by weight on a loss on ignition (hereinafter, referred to as "LOI") basis.

In weaving it is desired to subject the warp to secondary sizing treatment. As a treating agent for this secondary sizing treatment, the film forming agent component of the sizing agent which is used for the primary sizing treatment may be used alone or in admixture with some lubricant component. Concentration of the treating agent for the secondary sizing treatment is 0.5-3.0% by weight as an effective component. LOI of the treating agent in the secondary sizing treatment to glass yarns is desirably 0.2-1.0% by weight. Glass cloth made by weaving the glass yarns subjected to the primary and secondary sizing treatments in this way is transferred to a water washing step. Water may be used without any adjustment for washing, but preferably is adjusted to an acidic pH with acetic acid, formic acid or the like and furthermore, preferably, contains a small amount of a nonionic or cationic surface active agent. Moreover, water may contain several percent of a solvent which is effective for washing off the sizing agent used for the primary sizing treatment and is miscible with water. Apparatuses such as a mangle, vibrowasher, ultrasonic washer, high-pressure water jetting machine can be used for water washing. Then, the glass cloth is preferably sufficiently squeezed by a mangle to remove water entrained by the cloth or the cloth is dried before it is delivered to the step of surface treatment. At this stage, the amount of the sizing agent used for the primary sizing treatment which remains on the glass cloth without having been removed by washing with water (total amount of sizing agent for primary sizing treatment and sizing agent for secondary sizing treatment when secondary sizing treatment is carried out) should be 0.25% by weight or less.

Surface treatment is carried out by a usual method. That is, a suitable surface treating agent is selected depending on the use of the glass cloth. Examples of the surface treating agent are γ-aminopropyltriethoxysilane, N-β-(aminoethyl)-γ-aminopropyltrimethoxysilane, N-β-(N-vinylbenzylaminoethyl)-γ-aminopropyltrimethoxysilane hydrochloride, γ-methaacryloxypropyltrimethoxysilane, vinyl-tri(β-methoxyethoxy)silane, γ-glycidoxypropyltrimethoxysilane, and mixtures thereof.

As glass fibers used for making glass cloth according to the present invention, there may be used all of the fibers of E-glass (non-alkali glass, for electric insulation), D-glass (low dielectric glass), S-glass (glass of high modulus and high strength), and Q-glass (glass excellent in heat resistance and small in thermal expansion coefficient). Furthermore, the following advantages are provided by utilizing the method for producing glass cloth of the present invention. That is, as mentioned above, there have been the problems that when D-glass fiber is used, desizing with heat is difficult as compared with when E-glass fiber is used and that when S-glass fiber is used, the glass obtained by desizing with heat exhibits an effect of surface treatment with difficulty. Besides the characteristics of high modulus and a high strength of S-glass decrease owing to heating at high temperature for a long period of time. All of these problems can be solved by the method of the present invention.

According to the present invention, superior glass cloth can be produced by the steps of: subjecting filaments of the glass fiber to sizing treatment with a sizing agent containing at least one water-soluble film forming agent selected from the group consisting of amine-modified epoxy resin, epoxy resin to which ethylene oxide is added and bisphenol A to which ethylene oxide is added; forming glass yarns from the thus treated filaments; weaving the glass yarns; washing the obtained glass cloth with water; and then treating the glass cloth with a surface treating agent. By this method of the present invention, the step of desizing with heating is unnecessary. This step is carried out in the case of a glass cloth made by weaving glass yarns obtained by a sizing treatment with a normal starch type sizing agent.

That is, a glass cloth having characteristics equal or superior to those of a glass cloth obtained by treating with a normal starch sizing agent and desizing with a heating can be obtained by decreasing the LOI of the sizing agent of the glass cloth after water washing to 0.25% or less. This is because the sizing agent used in the present invention contains a synthetic resin type film forming agent and hence can exhibit a sizing effect with use of a small amount of the sizing agent being different from starch type sizing agent. Therefore, the amount of the sizing agent adhering to glass yarns can be reduced to 0.3-1.0% by weight and furthermore, since the film forming component which is a main component of sizing agent is water-soluble, the LOI of the sizing agent can be made at most 0.25% by weight only by water washing. When a starch type sizing agent is used, the LOI thereof to glass cloth is 1.0-3.0% by weight for a primary sizing treatment and 0.5-2.0% by weight for a secondary sizing treatment.

When a starch type sizing agent is used, the starch damages affinity and adhesion between the glass fiber and matrix resin and so the amount of the remaining sizing agent must be 0.1% by weight or less. It is difficult to decrease industrially the amount of the remaining sizing agent to less than 0.1% by weight in a desizing method using water washing and at present, there are no other effective means than desizing by heating.

The film forming agents in the sizing agent used in the present invention are epoxy resin and bisphenol A which is raw material for epoxy resin and which have been modified and water-solubilized. Therefore, these modified resins have compatibility with epoxy resins and polyester resins used as a matrix resin for laminate. Accordingly, there is no need to remove the sizing agent until LOI of the sizing agent decreases to 0.1% by weight or less as in the case of the starch type sizing agent and if the sizing agent can be removed by washing with water until LOI decreases to 0.25% by weight or less, a glass cloth, which has characteristics equal or superior to those of a glass cloth obtained by using a starch type sizing agent, carrying out desizing by heating, and then surface treating, can be obtained by carrying out the usual surface treatment after washing with water.

If the LOI is more than 0.25% by weight, the amount of film forming agent which adheres to the glass cloth is large and so impregnation of glass fiber yarns with a matrix resin cannot be sufficiently performed for making of the laminate and thus the desired effect cannot be obtained.

The sizing agent used in the present invention contains at least one film forming agent selected from the group consisting of amine-modified epoxy resin, epoxy resin to which ethylene oxide is added and bisphenol A to which ethylene oxide is added and besides, contains the above-mentioned silane coupling agent component and lubricant component and satisfies processability at a series of steps of spinning, twisting, warping and weaving. Furthermore, when the sizing agent of the present invention contains the silane coupling agent, the silane coupling agent is readily adsorbed to the surface of the glass fibers just after spinning which is in active state and a siloxane bond (Si-O-Si) is easily produced. Thus, the surface treating agent firmly bonds to the glass fibers. This is one factor for the improvement in the properties of glass cloth made by the method of the present invention. As the lubricant components to be added to the sizing agent of the present invention, there are selected those which give the least adverse effects on the interface between the glass fiber and the matrix resin when they remain on the surface of glass cloth after the water washing step.

For the amine-modified epoxy resin used in the sizing agent of the present invention, a suitable bisphenol type epoxy resin having 1-3 bisphenol nuclei in molecule and the amine-modified epoxy resin is desirably one obtained by reacting this epoxy resin with diethanolamine. A reaction rate of the epoxy resin with the diethanol amine is preferably such that at least 50% of the epoxy groups contained in one molecule of the epoxy resin react with the diethanolamine. If the reaction rate is less than 50%, the epoxy resin cannot have sufficient water-solubility.

For the epoxy resin and bisphenol A to which ethylene oxide is added, as in the case of the amine-modified epoxy resin, suitable are bisphenol type epoxy resins having 1-3 bisphenol nuclei and an amount of ethylene oxide to be added is at least 8 mols, preferably 8-13 mols. If the amount of ethylene oxide is less than 8 mols, sufficient water-solubility cannot be imparted to the epoxy resin. If it is more than 13 mols, water-solubility is too high, resulting in adverse effect on properties of the laminate.

Washing with water in the water washing step in the method of the present invention can be carried out by various methods. The simplest methods include: a method of washing a glass cloth with water by moving it up and down between rollers in water tank; a method of utilizing ultrasonic energy by providing an ultrasonic wave generator in water tank, a method of washing out the sizing agent by jet energy of a high-pressure fluid by jetting a high-pressure water jet fluid onto the glass cloth; and a vibro-washer method which comprises washing out sizing agent by moving glass cloth along a rotating cylinder having many holes from which high-pressure water is jetted.

In the water washing step employed in the present invention, the LOI of the sizing agent decreases by washing with water and simultaneously the LOI of the water-soluble film forming agent contained in the sizing agent decreases, whereby the gathering property of the filaments constituting the yarns also decreases. This provides the effect to improve impregnation of the matrix resin into the inner part of the glass yarns in making a laminate. The LOI of the sizing agent to the glass cloth subjected to a desizing by heating can also be less than 0.1%, but since the glass cloth is heated at high temperature, the glass yarns are heat set and filaments constituting the glass yarns are in the state of being gathered by heat setting thereof. Although substantially no sizing agent adheres thereto, which results in an insufficient impregnation of matrix resin into the inner part of glass yarns in molding of a laminate. The state of gathering of glass yarns due to heat setting can be relaxed to some extent by passing the glass cloth through the surface treating step after the heat desizing step, but the state cannot be completely solved. When a glass cloth obtained by heat desizing and a glass cloth obtained by the method of the present invention are compared on impregnation of the matrix resin into the inner part of the glass yarns, impregnation in the glass cloth obtained by the method of the present invention is far superior.

EXAMPLE 1

[I] Glass yarn (1) E-glass fiber: ECE 2251/0 IZ (manufactured by Nitto Boseki Co., Ltd.; monofilament diameter: 7μ)

(2) Components of sizing agent:

(a) Film forming component—Addition product (3% as effective ingredient) prepared by adding 1 mol of diethanolamine to EPIKOTE 828 (trademark for epoxy resin manufactured by Shell International Chemicals Corp.)

(b) Coupling agent—γ-Aminopropyltriethoxysilane (0.5%)

(c) Lubricant—Butyl stearate (0.5% as effective ingredient) and tetraethylenepentamine stearate (0.05% as effective ingredient)

(d) Water—the remainder (3) pH of sizing agent: adjusted to about 5 with acetic acid.

(4) Method of sizing treatment with sizing agent:

The sizing agent was applied to a group of glass fibers spun from bushing by an apron type sizing agent coating apparatus and the thus treated fibers were gathered by gathering roller to make strands. The strands were wound up by wind-up machine and twisted by a twister to make yarns.

(5) LOI of sizing agent: 0.35% by weight

[II] Weaving for making glass cloth

The glass yarns obtained in the above [I] were subjected to secondary sizing treatment (only warp) and then woven in the following manner to make a glass cloth.

(1) Secondary sizing treatment:

Warps were subjected to sizing treatment with an addition product (1.5% by weight as effective ingredient) obtained by adding 1 mol of diethanolamine to EPIKOTE 828.

(2) LOI of the addition product applied by the secondary sizing treatment:

0.3% by weight for warp (about 0.15% by weight for the whole glass cloth). Total LOI according to the primary and secondary treatments was 0.5% by weight.

(3) Weave:

Plain weave — Warp: 60 Counts/25 mm
Weft: 56 Counts/25 mm (4) Weaving method: Weaving was carried out by air jet loom.

[III] Washing with water

Sizing agents adhering to the cloth of [II] which were applied by the primary and the secondary sizing treatments were washed out by a high-pressure water jetting apparatus. The high-pressure water was uniformly jetted to the whole surface of the cloth by rotating nozzle and jetting pressure was 50 kg/cm². After washed with water, the cloth was dried prior to entering into the next surface treating step. LOI of remaining sizing agents and so on was 0.15%.

[IV] Surface treating agent (1) Surface treating agent:

N-β-(N-vinylbenzylaminoethyl)-γ-aminopropyl-trimethoxysilane hydrochloride [Trade mark: SZ6032 (manufactured by Toray silicone Co.), (0.3% by weight as effective ingredient)].

(2) Preparation of aqueous solution of the surface treating agent:

The surface treating agent was dissolved in water having a pH adjusted with acetic acid by adding thereto with stirring.

(3) Treating method:

Glass cloth was dipped in the aqueous solution of surface treating agent, squeezed by a mangle to remove liquid and dried.

(4) LOI of treating agent after surface treatment:

0.26% by weight (LOI amount of remaining sizing agent+LOI amount of surface treating agent)

EXAMPLE 2

[I] Glass yarns (1) E-glass fiber: Sizing treatment was conducted in the same manner as in Example 1 except using ECG 75 1/0 1Z (manufactured by Nitto Boseki Co., Ltd.; monofilament diameter: 9μ).

(2) LOI of sizing agent: 0.40% by weight

[II] Weaving for making glass cloth (1) Secondary sizing treatment: Secondary sizing treatment was carried out in the same manner as in Example 1.

(2) Weave:

Plain weave — Warp: 41 Counts/25 mm
Weft: 32 Counts/25 mm (3) Method of weaving: Weaving was carried out in the same manner as in Example 1.

[III] Washing with water:

(1) Washing was carried out in the same manner as in Example 1.

(2) LOI after washing with water: 0.08% by weight

[IV] Surface treatment (1) Treatment was carried out in the same manner as in Example 1.

(2) LOI after surface treatment: 0.15% by weight

COMPARATIVE EXAMPLE 1

Glass cloth obtained according to [I] and [II] of Example 1 was used.

COMPARATIVE EXAMPLE 2

Glass cloth obtained according to [I] and [II] of Example 2 was used.

COMPARATIVE EXAMPLE 3

(1) Starch type sizing agent having the following composition was applied to the same glass fibers as in Example 1 by the same sizing method as in Example 1. LOI of the sizing agent was 1.6%.

| Composition of the starch type sizing agent: | |
| --- | --- |
| Dextrin starch | 6.0% by weight |
| Hydrogenated vegetable oil | 2.0% by weight |
| Cationic softener | 0.12% by weight |
| Emulsifier | 0.1% by weight |
| Water | The remainder. |

(2) Secondary sizing treatment:

Starch type secondary sizing treatment was carried out by a sizer. LOI of secondary sizing treating agent was 1.0% for warps (0.5% by weight for the whole glass cloth).

(3) Weaving method: Same as in Example 1.
(4) Desizing method: By heating.
(5) Surface treating method: Same as in Example 1. LOI of surface treating agent was 0.07% by weight.

COMPARATIVE EXAMPLE 4

(1) Primary sizing treatment with starch type sizing agent, secondary sizing treatment, weaving, desizing, and surface treatment were carried out in the same manner as in Comparative Example 3 using the same glass fibers as used in Example 2. LOI of surface treating agent was 0.08% by weight.

(2) The surface treatment was carried out in the same manner as in Example 1.

COMPARATIVE EXAMPLE 5

Glass cloth was made in the same manner as in [I], [II], [III] and [IV] of Example 1 except that LOI of sizing agent after washing with water in [III] of Example 1 was 0.30% by weight.

Laminates were prepared using the glass cloth obtained in the above Examples 1-2 and Comparative Examples 1-5 as reinforcing material and G-10 type epoxy resin varnish for printed circuit substrate as matrix resin and impregnating ability of the glass cloths and properties of the laminates (water absorption and soldering heat resistance) were tested. The results are shown in Table 3 and Table 4.

Preparation of Laminate Sheet Test Piece

The surface treated glass cloth was impregnated with G-10 type (JIS) epoxy resin varnish, followed by drying at 130° C. for 15 minutes to obtain a prepreg. Five prepregs thus obtained (in the case of using glass cloths of Example 1 and Comparative Examples 1, 3 and 5) and eight prepregs thus obtained (in the case of using glass cloths of Example 2 and Comparative Examples 2 and 4) were stacked and copper foils were put on upper and lower sides of the stack. Respective stacks were molded by heating at 175° C. for 60 minutes under a load of 40 kg/cm$^2$. The copper foils were removed by etching to obtain laminate test pieces.

(1) Water absorption:
The laminate test piece was boiled for 45 minutes (or 75 minutes) by a pressure cooker (PC) of 133° C. in an autoclave and water absorption (%) of the test piece was measured.

(2) Soldering heat resistance test:
The laminate test piece was boiled for 30 minutes, 45 minutes, 60 minutes (or 60 minutes, 75 minutes, 90 minutes) by a pressure cooker (PC) of 133° C. and thereafter, was dipped in a soldering bath of 260° C. for 20 seconds and then taken out therefrom. Presence of blister on the surface or peeling was examined and boiling time before occurrence of these defects was taken as soldering heat resisting time.

(3) Test on impregnating ability:
A glass cloth of 10 cm×10 cm was gently floated on a resin of 120 cps in viscosity and time required for air bubbles in the strands having completely disappeared was measured.

TABLE 3

| | Impregnating ability of glass cloth | Properties of Laminate | | | |
|---|---|---|---|---|---|
| | | Water absorption (%) by weight | Soldering heat resistance | | |
| | | PC 45 min | PC 30 min | PC 45 min | PC 60 min |
| Example 1 | 5.5 minutes | 1.20 | ○○○ | ○○○ | ○○○ |
| Comparative Example 1 | 60 minutes< | 1.30 | ○ΔΔ | ΔΔx | xxx |
| Comparative Example 3 | 15.0 minutes | 1.42 | ○○Δ | ○○x | xxx |
| Comparative Example 5 | 9.0 minutes | 1.22 | ○○○ | ○○x | xxx |

[Note]:
(1) PC 45 minutes means that measurement was conducted on a test piece after boiled for 45 minutes by pressure cooker. Others of different boiling time have the same meaning.
(2) Evaluation of results of soldering heat resistance test.
○: There was no blister.
Δ: There was one small blister.
x: There were two or more blisters.

TABLE 4

| | Impregnating ability of glass cloth | Properties of Laminate | | | |
|---|---|---|---|---|---|
| | | Water absorption (%) by weight | Soldering heat resistance | | |
| | | PC 75 min | PC 60 min | PC 75 min | PC 90 min |
| Example 2 | 6.5 minutes | 0.81 | ○○○ | ○○○ | ○Δx |
| Comparative Example 2 | 60 minutes< | 0.88 | ○ΔΔ | ΔΔx | xxx |
| Comparative Example 4 | 23.5 minutes | 0.91 | ○○○ | ○○x | xxx |

EXAMPLE 3

[I] Glass yarns (1) Sizing treatment was conducted in the same manner as in Example 1 except using D-glass fiber: DCE 270 1/0 1 Z (manufactured by Japan Electric Glass Co., Ltd.; monofilament diameter: 7μ).

(2) LOI of sizing agent: 0.35% by weight

[II] Weaving for making glass cloth (1) Secondary sizing treatment: Same as in Example 1.

(2) LOI of addition product by the secondary sizing treatment: 0.15% by weight for glass cloth. Therefore, total LOI by the primary and secondary sizing treatments was 0.5% by weight.

(3) Weave: Same as in Example 1.

(4) Method of weaving: Same as in Example 1.

[III] Washing with water

Same as in Example 1. LOI of the remaining sizing agent was 0.15% by weight.

[IV] Surface treatment (1) Same as in Example 1.

(2) LOI after the surface treatment: 0.27% by weight

EXAMPLE 4

[I] Glass yarns (1) Sizing treatment was conducted in the same manner as in Example 1 except using S-glass fiber: TCE 225 1/0 1 Z (manufactured by Nitto Boseki Co., Ltd.).

(2) LOI of sizing agent: 0.35% by weight

[II] Weaving for making glass cloth

Same as in Example 3.

[III] Washing with water

Same as in Example 3.

[IV] Surface treatment

Same as in Example 3.

COMPARATIVE EXAMPLE 6

D-glass cloth obtained according to [I] and [II] of Example 3 was used. Accordingly, total LOI by the primary and secondary sizing treatments was 0.5% by weight.

COMPARATIVE EXAMPLE 7

(1) The same starch type sizing agent as used in Comparative Example 3 was applied to the same D-glass fibers as used in Example 3 by the same sizing method as in Example 3. LOI of the sizing agent was 1.6% by weight.

(2) Secondary sizing treatment: Same as in Comparative Example 3. LOI of the secondary sizing agent was 0.5% by weight for the whole glass cloth.

(3) Weaving method: Same as in Example 3.

(4) Desizing method: Heating.

(5) Surface treatment: Same as in Example 3. LOI of the surface treating agent was 0.07% by weight.

COMPARATIVE EXAMPLE 8

A glass cloth was produced in the same manner as in Example 1 except that LOI of sizing agent after washing with water of [III] of Example 3 was 0.3% by weight.

COMPARATIVE EXAMPLE 9

(1) The same starch type sizing agent as used in Comparative Example 3 was applied to the same S-glass fibers as used in Example 4 by the same sizing method as in example 4. LOI of the sizing agent was 1.7% by weight.

(2) Secondary sizing treatment: Same as in Comparative Example 3. LOI of the second sizing agent was 0.5% by weight for the whole glass cloth.

(3) Weaving method: Same as in Example 3.

(4) Desizing method: Heating.

(5) Surface treatment: Same as in Example 3. LOI of the surface treating agent was 0.07% by weight.

Laminate was prepared by using the glass cloth obtained in the above Example 3 and Comparative Examples 6–8 as reinforcing material and G-10 type epoxy resin varnish as matrix resin and impregnation of the resin into glass cloth in the laminate and properties of the laminate (appearance and color shade, water absorption and soldering heat resistance) were tested. The results are shown in Table 5.

Example 5

|  | Impregnating ability of glass cloth | Properties of laminate | | Soldering heat resistance | | |
|---|---|---|---|---|---|---|
|  |  | Appearance | Water absorption (%) by weight PC 45 min | PC 30 min | PC 45 min | PC 60 min |
| Example 3 | 6.0 minutes | ◯ | 1.20 | ◯◯◯ | ◯◯◯ | ◯◯◯ |
| Comparative Example 6 | 60 minutes< | ◯ | 1.32 | ◯△△ | △△x | xxx |
| Comparative Example 7 | 17.0 minutes | Light yellow | 1.44 | ◯◯△ | ◯△x | xxx |
| Comparative Example 8 | 9.5 minutes | ◯ | 1.23 | ◯◯◯ | ◯◯x | xxx |

Note: "◯" in the appearance means no changes in appearance and color shade.

Tensile strength of greige glass cloth just after woven and glass cloth after subjected to surface treatment which were in Example 4 and Comparative Example 9 was measured and the results are shown in Table 6.

TABLE 6

|  | Example 4 | | Comparative Example 9 | |
|---|---|---|---|---|
|  | Warp | Weft | Warp | Weft |
| Tensile strength of greige cloth just after woven (kg/25 mm) | 106.0 | 95.8 | 101.5 | 90.3 |
| Tensile strength of cloth after surface treatment (kg/25 mm) | 102.4 | 93.2 | 58.0 | 56.4 |

As shown in Comparative Example 7 of Table 5, in the case of D-glass cloth made from D-glass fibers using conventional starch type sizing agent and by carrying out desizing by heating, it was difficult to carry out complete desizing and laminate made using this cloth colored. On the other hand, in the case of Example 3, since the sizing agent had affinity with matrix resin and besides LOI amount of the sizing agent was reduced to 0.25% by weight or less by washing with water, the laminate produced neither colored nor whitened due to insufficient impregnation the of resin.

Furthermore, in Example 3 the amount of the sizing agent remaining after washing with water was 0.25% by weight or less which was smaller than those in Comparative Examples 6 and 8. Therefore, in Example 3, the degree of gathering of yarns is low and besides, the sizing agent had affinity with a matrix resin and hence impregnation of varnish resin into cloth was superior. As a result, the adhesion between the matrix resin and glass fiber was high and the reinforcing effect of the glass fiber was superior. This fact is considered to bring about the excellent water absorption and soldering heat resistance of the laminate produced.

Table 6 shows tensile strength of greige S-glass cloth just after weaving and S-glass cloth after being subjected to the surface treatment in Example 4 and in Comparative Example 9. Since in Comparative Example 9, the sizing agent was removed by heat desizing, tensile strength of the cloth after being subjected to surface treatment decreased to about 50–60% of that of the cloth before being subjected to surface treatment while, in Example 4 the tensile strength after being subjected to the surface treatment was nearly the same as that of the greige cloth just after weaving because the sizing agent was removed only by washing with high-pressure water and the characteristics of S-glass fibers were exhibited.

According to the present invention, the following advantageous effects can be obtained. 1. Desizing step by heating is not necessary and thus cost can be sharply reduced. 2. Impregnation of matrix resin into glass cloth can be greatly improved.

3. Properties of laminate such as water absorption and soldering heat resistance are improved.

4. In addition to the above effects, the following advantageous effects can further be obtained in the case of glass cloth of high $SiO_2$ content.

(a) In the case of D-glass cloth, impregnating ability for resin is high. Laminate made therefrom show no coloration and has superior in properties. Besides, there are no problems such as evaporation of $B_2O_3$ since heating for a long period of time is not carried out.

(b) In the case of S-glass cloth, glass cloth which exhibits a reinforcing effect with maintaining tensile strength which is a characteristic of S-glass fibers can be obtained.

(c) In the case of Q-glass cloth, tearing which is apt to occur in desizing by heating can be inhibited.

Furthermore, when a sizing agent adhering to the glass cloth is removed by heat desizing and thereafter the cloth is subjected to surface treatment as in the conventional method, the coupling agent present in the sizing agent does not exert complete action. When glass yarns made from glass fibers subjected to sizing treatment with a sizing agent containing silane coupling agent in the surface active state just after spinning at the time of spinning of glass fibers are used, the silane coupling agent is easily adsorbed to the surface of glass fibers and furthermore, the siloxane bond (Si-O-Si) is easily produced and the surface treating agent firmly adheres to the glass fibers hence even when the film forming component in the sizing agent is removed by washing with water, the glass cloth having the desired surface can be obtained.

What is claimed is:

1. A method for producing a treated glass cloth for a fiber-reinforced resin which comprises the steps of:
   (a) subjecting filaments of glass fibers to a primary sizing treatment with a non-starch based primary sizing agent comprising at least one water-soluble film forming agent selected from the group consisting of an amine-modified epoxy resin, an ethylene oxide-added epoxy resin, and an ethylene oxide-added bisphenol A, the treated glass fibers having at least 0.3% of said primary sizing agent;
   (b) forming glass yarns from the treated filaments;
   (c) weaving the glass yarns to make a glass cloth;
   (d) washing the glass cloth with water having a neutral or acidic pH until loss on ignition of the sizing agent to the glass cloth reaches 0.25% by weight or less; and
   (e) treating the washed glass cloth with a solution of a surface treating agent selected from the group consisting of γ-aminopropyltriethoxysilane, N-β-(amioethyl)-γ-aminopropyltrimethoxysilane, N-β-(N-vinylbenzylaminoethyl)-γ-aminopropyltrimethoxysilane hydrochloride, γ-methacryloxypropyltrimethoxysilane, vinyl-tri (β-methoxyethoxy) silane, γ-gylcidoxypropyl-trimethoxysilane, and mixtures thereof.

2. A method according to claim 1, wherein the primary sizing agent further comprises a coupling agent and a lubricant.

3. A method according to claim 1, wherein the film forming agent in the sizing agent is present in an amount of 1.0–5.0% by weight.

4. A method according to claim 2, wherein the coupling agent is a silane coupling agent.

5. A method according to claim 2, wherein the coupling agent in the primary sizing agent is present in an amount of 0.05–2.0% by weight.

6. A method according to claim 2, wherein the lubricant comprises tetraethylenepentamine distearate and butyl stearate.

7. A method according to claim 6, wherein content of the lubricant in the primary sizing agent is 0.03–0.15% by weight for tetraethylenepentamine distearate and 0.2–1.0% by weight for butyl stearate.

8. A method according to claim 1, wherein the loss on ignition of the primary sizing agent to the glass yarns is 0.3–1.0% by weight.

9. A method according to claim 1, further comprising subjecting the glass yarns produced in step (b) to a secondary sizing treatment with a secondary sizing agent to enable the glass yarns to be used as warps in weaving.

10. A method according to claim 9, wherein the secondary sizing agent further comprises a lubricant.

11. A method according to claim 1, wherein said water contains a nonionic or cationic surface active agent.

12. A method according to claim 1, wherein the glass fibers are E-glass fibers, D-glass fibers, S-glass fibers or Q-glass fibers.

13. A method according to claim 1, wherein the amine-modified epoxy resin and the ethylene oxide-added epoxy resin are bisphenol type epoxy resins having 1-3 bisphenol nuclei in the molecule of the epoxy resin.

14. A resin laminate which comprises the glass cloth obtained in claim 1.

15. A resin laminate according to claim 14, wherein the glass cloth is impregnated with a matrix resin.

16. A resin laminate according to claim 15, wherein the laminate comprises a prepreg.

* * * * *